US009627525B2

(12) United States Patent
Hiyoshi et al.

(10) Patent No.: US 9,627,525 B2
(45) Date of Patent: Apr. 18, 2017

(54) SILICON CARBIDE SEMICONDUCTOR DEVICE

(71) Applicant: Sumitomo Electric Industries, Ltd., Osaka-shi (JP)

(72) Inventors: Toru Hiyoshi, Osaka (JP); Keiji Wada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/021,624

(22) PCT Filed: Jul. 28, 2014

(86) PCT No.: PCT/JP2014/069797
§ 371 (c)(1),
(2) Date: Mar. 11, 2016

(87) PCT Pub. No.: WO2015/037348
PCT Pub. Date: Mar. 19, 2015

(65) Prior Publication Data
US 2016/0225891 A1    Aug. 4, 2016

(30) Foreign Application Priority Data

Sep. 12, 2013    (JP) .................................. 2013-189578

(51) Int. Cl.
*H01L 29/78*    (2006.01)
*H01L 27/07*    (2006.01)
(Continued)

(52) U.S. Cl.
CPC ...... *H01L 29/7806* (2013.01); *H01L 21/0495* (2013.01); *H01L 27/0727* (2013.01);
(Continued)

(58) Field of Classification Search
CPC . H01L 29/1608; H01L 29/47; H01L 29/7802; H01L 29/7806; H01L 29/7813;
(Continued)

(56) References Cited

U.S. PATENT DOCUMENTS 9,214,458 B2 * 12/2015 Hino ................... H01L 29/1608
9,246,016 B1 * 1/2016 Yen ..................... H01L 29/8083
(Continued)

FOREIGN PATENT DOCUMENTS

JP    2002-299625 A    10/2002
JP    2003-229570 A    8/2003
(Continued)

OTHER PUBLICATIONS

International Search Report in PCT International Application No. PCT/JP2014/069797, mailed Nov. 4, 2014.

*Primary Examiner* — Stephen W Smoot
(74) *Attorney, Agent, or Firm* — Venable LLP; Michael A. Sartori; Laura G. Remus

(57) ABSTRACT

Provided is a silicon carbide semiconductor device that enables integration of a transistor element and a Schottky barrier diode while avoiding the reduction of an active region. A silicon carbide semiconductor device includes a silicon carbide layer, a gate insulating film, a Schottky electrode being Schottky functioned to a drift layer via a first contact hole and an opening, a gate electrode being arranged on the gate insulating film, an insulating layer being arranged so as to cover the gate insulating film, the gate electrode, and the Schottky electrode and having a second contact hole for exposing the gate electrode, and a gate pad electrode being arranged on the insulating layer so as to overlap the Schottky electrode in a plan view and being electrically connected to the gate electrode via the second contact hole.

7 Claims, 15 Drawing Sheets

(51) Int. Cl.
  *H01L 29/47* (2006.01)
  *H01L 29/16* (2006.01)
  *H01L 21/04* (2006.01)
  H01L 29/872 (2006.01)
  H01L 29/66 (2006.01)
  H01L 29/04 (2006.01)

(52) U.S. Cl.
  CPC .......... *H01L 29/1608* (2013.01); *H01L 29/47* (2013.01); *H01L 29/7813* (2013.01); H01L 29/045 (2013.01); H01L 29/6606 (2013.01); H01L 29/66068 (2013.01); H01L 29/872 (2013.01)

(58) Field of Classification Search
  CPC   H01L 29/872; H01L 27/0716; H01L 27/0727
  See application file for complete search history.

(56) References Cited

U.S. PATENT DOCUMENTS

| | | | | |
|---|---|---|---|---|
| 2004/0251503 A1* | 12/2004 | Hayashi | ............... | H01L 29/739 257/368 |
| 2013/0032823 A1* | 2/2013 | Hayashi | ............. | H01L 21/8213 257/77 |
| 2013/0313570 A1* | 11/2013 | Sdrulla | ............... | H01L 29/7806 257/77 |
| 2015/0349051 A1* | 12/2015 | Uchida | ............... | H01L 29/0619 257/77 |

FOREIGN PATENT DOCUMENTS

| JP | 2009-088326 A | 4/2009 |
|---|---|---|
| JP | 2009-194127 A | 8/2009 |

\* cited by examiner

SILICON CARBIDE SEMICONDUCTOR DEVICE

TECHNICAL FIELD

The present invention relates to a silicon carbide semiconductor device. More particularly, the present invention relates to a silicon carbide semiconductor device including a transistor element and a Schottky barrier diode.

BACKGROUND ART

In recent years, silicon carbide (SiC) has begun to be adopted as a material constituting a semiconductor device. As a semiconductor device adopting a silicon carbide substrate, there has been proposed a semiconductor device which integrates a transistor element and a Schottky barrier diode (hereinafter, also referred to as SBD).

For example, according to Japanese Patent Laying-Open No. 2009-194127 (PTD 1), a silicon carbide semiconductor device has a DMOSFET region and an SBD region. The SBD region and the DMOSFET region are different regions. For example, according to Japanese Patent Laying-Open No. 2003-229570 (PTD 2), the SBD is constituted of a portion of a drain region of a field effect transistor that is not covered with a gate insulating film, and metal. For example, according to Japanese Patent Laying-Open No. 2009-88326 (PTD 3), the SBD is formed between two cells of a MOSFET.

CITATION LIST

Patent Documents

PTD 1: Japanese Patent Laying-Open No. 2009-194127
PTD 2: Japanese Patent Laying-Open No. 2003-229570
PTD 3: Japanese Patent Laying-Open No. 2009-88326

SUMMARY OF INVENTION

Technical Problem

Japanese Patent Laying-Open No. 2009-194127 does not specifically disclose an arrangement of the SBD region in the semiconductor device. Generally, a semiconductor device is achieved in a form of a semiconductor chip. Arranging both of the SBD region and the DMOSFET region in the semiconductor device causes a problem that an area of the semiconductor chip increases.

On the other hand, according to Japanese Patent Laying-Open No. 2003-229570, the SBD is unified with a transistor cell. Therefore, the size of the transistor cell increases. According to Japanese Patent Laying-Open No. 2003-229570, the SBD is arranged between a plurality of transistor cells. Therefore, a space between the plurality of transistor cells increases. According to these configurations, an area of an active region of a MOSFET, in other words, an area of a region contributing to a current flow in a MOSFET is reduced. In other words, an area of a semiconductor chip required to allow a flow of a certain amount of current increases.

An object of the present invention is to provide a silicon carbide semiconductor device that enables integration of a transistor element and a Schottky barrier diode while avoiding the reduction of an active region.

Solution to Problem

A silicon carbide semiconductor device in accordance with one aspect of the present invention includes a silicon carbide layer having a first main surface and a second main surface located on a side opposite to the first main surface. The silicon carbide layer includes a drift layer having a first conductivity type and defining the first main surface of the silicon carbide layer, and a body region being provided on a drift layer, having a second conductivity type different from the first conductivity type, and being provided with at least one opening for exposing the drift layer. The silicon carbide semiconductor device includes a gate insulating film being arranged on the first main surface of the silicon carbide layer and having a first contact hole for exposing the first main surface at a position corresponding to the opening, a Schottky electrode being Schottky functioned to the drift layer via the first contact hole and the opening, a gate electrode being arranged on the gate insulating film, an insulating layer being arranged so as to cover the gate insulating film, the gate electrode, and the Schottky electrode and having a second contact hole for exposing the gate electrode, and a gate pad electrode being arranged on the insulating layer so as to overlap the Schottky electrode in a plan view and electrically connected to the gate electrode via the second contact hole.

Advantageous Effects of Invention

According to the present invention, a silicon carbide semiconductor device can be provided that enables integration of a transistor element and a Schottky barrier diode while avoiding the reduction of an active region.

DESCRIPTION OF EMBODIMENTS

Figure 1:
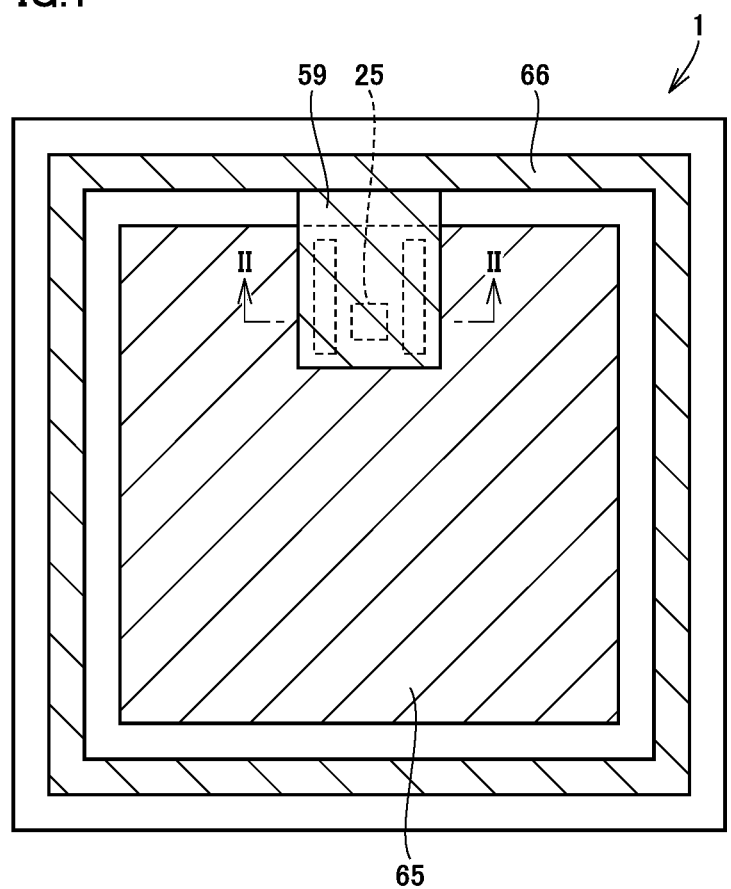
FIG. 1 is a plan view schematically showing a configuration of a silicon carbide semiconductor device 1 in accordance with a first embodiment of the present invention.

Description of Embodiments of the Present Invention

Firstly, embodiments of the present invention will be listed and described.

(1) A silicon carbide semiconductor device (1, 1A, 1B) in accordance with an embodiment of the present invention includes a silicon carbide layer (10) having a first main surface (10a) and a second main surface (10b) located on a side opposite to first main surface (10a). Silicon carbide layer (10) includes a drift layer (12) having a first conductivity type and defining first main surface (10a) of silicon carbide layer (10), and a body region (13) being provided on drift layer (12), having a second conductivity type different from the first conductivity type, and being provided with at least one opening (30a) for exposing drift layer (12). Silicon carbide semiconductor device (1, 1A, 1B) includes a gate insulating film (15) being arranged on first main surface (10a) of silicon carbide layer (10) and having a first contact hole (GH1) for exposing first main surface (10a) on opening (30a), a Schottky electrode (25) being Schottky-junctioned to drift layer (12) via first contact hole (GH1) and opening (30a), a gate electrode (27) being arranged on gate insulating film (15), an insulating layer (70) being arranged so as to cover gate insulating film (15), gate electrode (27), and Schottky electrode (25) and having a second contact hole for exposing gate electrode (27), and a gate pad electrode (59) being arranged on insulating layer (70) so as to overlap Schottky electrode in a plan view and electrically connected to gate electrode (27) via the second contact hole.

According to this configuration, a silicon carbide semiconductor device that enables integration of a transistor element and a Schottky barrier diode while avoiding the reduction of an active region can be achieved. The gate pad electrode occupies a relatively large area in the semiconductor chip. By arranging the Schottky electrode under this gate pad electrode, a Schottky barrier diode is formed under the gate pad electrode. Under the gate pad electrode, a transistor element is not formed. Therefore, reduction of an active region can be prevented.

It should be noted that the "plan view" corresponds to viewing the first main surface (or the second main surface) along a normal line direction of the first main surface.

(2) Preferably, opening (30a) is arranged inside of first contact hole (GH1). Schottky electrode (25) is Schottky functioned to both of drift layer (12) and body region (13).

According to this configuration, since the Schottky electrode is Schottky-junctioned also to the first region, the Schottky electrode can directly implant and draw out a carrier with respect to the first region. Thus, a breakdown voltage can be secured more certainly.

When a depletion layer is present between the drift layer and the body region, the depletion layer can be reduced more promptly by implanting a carrier from the Schottky electrode to the body region. It should be noted that, in this specification, the reduction of the depletion layer is also referred to as "releasing depletion."

On the other hand, when a reverse bias voltage is applied between the drift layer and the body region, the depletion layer can be expanded more promptly by drawing out a carrier from the Schottky electrode. Accordingly, a breakdown voltage can be secured.

(3) Preferably, silicon carbide layer (10) is further includes a first region (14) being arranged in body region (13) and having the first conductivity type, and a second region (18) being arranged in body region (13) and having the second conductivity type. Insulating layer (70) includes a first interlayer insulating film (71) being arranged so as to cover gate insulating film (15) and gate electrode (27) and having a third contact hole for exposing Schottky electrode (25) and a fourth contact hole for exposing first and second regions (14, 18), and a second interlayer insulating film (72) being arranged on first interlayer insulating film (71). Silicon carbide semiconductor device (1, 1A, 1B) further includes a source pad electrode being arranged on first interlayer insulating film (71), being electrically connected to Schottky electrode (25) via the third contact hole, and being electrically connected to first and second regions (14, 18) via the fourth contact hole.

According to this configuration, a transistor and a freewheel diode can be integrated into one semiconductor chip. Accordingly, a circuit like an inverter circuit including a transistor and a freewheel diode can be achieved with more miniaturized and simplified configuration.

(4) Preferably, at least one opening (30a) is a plurality of openings separated by a space. Gate electrode (27) is electrically connected to gate pad electrode (59) at an outer circumference portion of gate pad electrode (59). In a plan view, the plurality of openings are located on an inner side than gate electrode (27) and arranged so as to surround a central portion (40, 45) of gate pad electrode (59).

According to this configuration, by arranging the plurality of opening with a space provided therebetween, division of the region on an inner side than the plurality of openings and a region on an outer side than the plurality of openings can be prevented. Thus, it can prevent an electric potential of one of these two regions (for example, a region on an outer side than the plurality of openings) from being a floating electric potential.

Further, likelihood of damaging the Schottky barrier diode can be reduced. For example, during a test of the silicon carbide semiconductor device, there is a case where a probe needle comes into contact with the gate pad electrode. Moreover, in a wire bonding step, a wire is connected to the gate pad electrode. In these cases, a shock is likely to be applied to a central portion of the gate pad electrode. By arranging the Schottky barrier diode while avoiding the central portion of the gate pad electrode, likelihood of damaging the Schottky barrier diode due to a shock can be reduced.

(5) Preferably, a length of the space between the plurality of openings (30a) is fixed.

According to this configuration, division of the region on an inner side than the plurality of openings and a region on an outer side than the plurality of openings can be prevented.

(6) Preferably, opening (30a) has a trench (TR) penetrating through body region (13) to reach drift layer (12). Schottky electrode (25) is arranged so as to cover an inner circumferential surface of trench (TR).

According to this configuration, an area of the Schottky electrode being Schottky functioned to the silicon carbide layer can be increased. Thus, more carriers can be implanted and drawn out via the Schottky electrode.

(7) Preferably, the first conductivity type is n-type, and the second conductivity type is p-type.

According to this configuration, easiness in manufacturing a silicon carbide semiconductor device can be improved.

Details of Embodiments of the Present Invention

Hereinafter, embodiments of the present invention will be described with reference to the drawings. It should be noted that, in the below-mentioned drawings, the same or corresponding portions are given the same reference characters and are not described repeatedly. Further, regarding crystallographic indications in the present specification, an individual orientation is represented by [ ], a group orientation is represented by < >, an individual plane is represented by ( ) and a group plane is represented by { }. In addition, a negative crystallographic index is normally expressed by putting "-" (bar) above a numeral, but is expressed by putting the negative sign before the numeral in the present specification. Moreover, as to description of angles, the system having an omnidirection angle of 360 degrees is used.

First Embodiment

Figure 2:
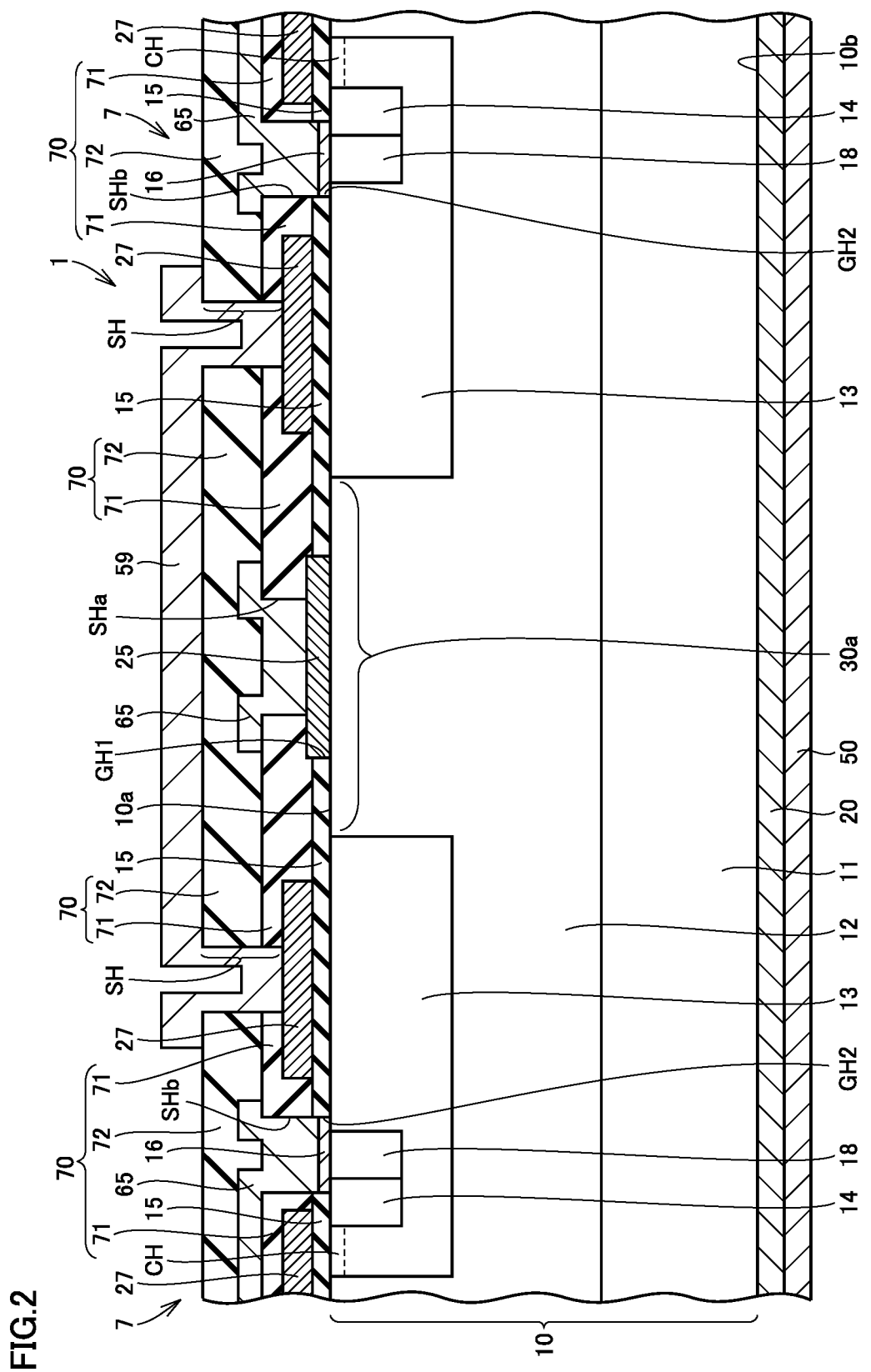
FIG. 2 is a cross sectional view taken along the II-II line of FIG. 1.

FIG. 1 is a plan view schematically showing a configuration of a silicon carbide semiconductor device 1 in accordance with a first embodiment of the present invention. FIG. 2 is a cross sectional view taken along the II-II line of FIG. 1. Referring to FIGS. 1 and 2, silicon carbide semiconductor device 1 in accordance with one embodiment of the present invention has a silicon carbide layer 10, a gate insulating film 15, a source electrode 16, a gate electrode 27, a Schottky electrode 25, an insulating layer 70, a gate pad electrode 59, a gate runner 66, a source pad electrode 65, a drain electrode 20, and a backside surface protecting electrode 50.

Silicon carbide layer 10 has a first main surface 10a and a second main surface 10b. Second main surface 10b is located on a side opposite to first main surface 10a.

Silicon carbide layer 10 has an n+ substrate 11 and a drift layer 12. N+ substrate 11 is made of, for example, hexagonal crystal silicon carbide of polytype 4H. N+ substrate 11 contains highly-concentrated impurities (donor). The concentration of the impurities contained in n+ substrate 11 is, for example, about $1.0 \times 10^{18}$ cm$^{-3}$. A kind of the impurities is, for example, N (nitrogen).

Drift layer 12 is arranged on n+ substrate 11. Drift layer 12 is a layer which is formed by an epitaxial growth. Drift layer 12 is made of, for example, hexagonal crystal silicon carbide of polytype 4H. A surface of drift layer 12 defines first main surface 10a of silicon carbide layer 10.

The impurity concentration of drift layer 12 is lower than the impurity concentration of n+ substrate 11. For example, the impurity concentration of drift layer 12 is about $7.5 \times 10^{15}$ cm$^{-3}$. The thickness of drift layer 12 is, for example, about greater than or equal to 10 μm and about less than or equal to 35 μm. The impurity contained in drift layer 12 is, for example, nitrogen.

In this embodiment, silicon carbide semiconductor device 1 includes a plurality of transistor elements 7. Transistor element 7 is a MOSFET (Metal Oxide Semiconductor Field Effect Transistor). A body region 13 is arranged in drift layer 12 to constitute the MOSFET. Further, a source region 14 (first region) and a p+ region 18 (second region) are arranged in body region 13.

Body region 13 is a region having p-type which is different from n-type. The impurity concentration in a deep portion of the body region is about $1 \times 10^{18}$ cm$^{-3}$. The thickness of body region 13 is, for example, greater than or equal to 0.5 μm and less than or equal to 1.0 μm.

As shown in FIG. 2, an opening 30a is provided at a portion of body region 13 located under gate pad electrode 59. Opening 30a exposes drift layer 12 to first main surface 10a of the silicon carbide layer. In other words, a conductivity type of the region under opening 30a is n-type.

Source region 14 is a region having n-type. The concentration of impurities contained in source region 14 is higher than the concentration of impurities contained in drift layer 12. Source region 14 contains impurities such as P (phosphorus) with a concentration of about $1 \times 10^{20}$ cm$^{-3}$.

P+ region 18 is a region having p-type. P+ region 18 is arranged so as to be in contact with source region 14. The concentration of impurities contained in p+ region 18 is higher than the concentration of impurities contained in body region 13. P+ region 18 contains impurities such as aluminum or boron with a concentration of about $1 \times 10^{20}$ cm$^{-3}$.

Gate insulating film 15 is provided at a position facing a channel region CH formed in body region 13. Gate insulating film 15 is in contact with body region 13, source region 14, and drift layer 12 on first main surface 10a of silicon carbide layer 10. Gate insulating film 15 is made of, for example, silicon dioxide. The thickness of gate insulating film 15 (the size of gate insulating film 15 along a normal line direction of first main surface 10a) is, for example, about 50 nm.

In gate insulating film 15, a contact hole GH1 (first contact hole) is formed at a position overlapping opening 30a, and a contact hole GH2 is formed at a position overlapping source region 14 and p+ region 18. Contact holes GH1, GH2 expose first main surface 10a of silicon carbide layer 10. More specifically, contact hole GH1 exposes drift layer 12 through opening 30a. Contact hole GH2 exposes source region 14 and p+ region 18.

Schottky electrode 25 is arranged under gate pad electrode 59. Schottky electrode 25 is Schottky functioned to drift layer 12 via contact hole GH1 and opening 30a. A Schottky barrier diode (SBD) is formed under gate electrode 59 by Schottky electrode 25 and silicon carbide layer 10.

A material of Schottky electrode 25 is not particularly limited as long as it is metal which can achieve a Schottky barrier with drift layer 12, in other words, the silicon carbide semiconductor layer. For example, the material may be titanium (Ti), nickel (Ni), titanium nitride (TiN), gold (Au), molybdenum (Mo), and tungsten (W).

Gate electrode 27 is arranged on gate insulating film 15. Gate electrode 27 faces drift layer 12, source region 14, and body region 13 so as to extend from above source region 14 of transistor element 7 to above another source region 14. Gate electrode 27 is made of, for example, a conductor such as polysilicon having impurities added, or aluminum.

Insulating layer 70 is arranged so as to cover gate insulating film 15, gate electrode 27, and Schottky electrode 25. A contact hole SH (second contact hole) for exposing gate electrode 27 is formed in insulating layer 70.

More specifically, insulating layer 70 includes a first interlayer insulating film 71 and a second interlayer insulating film 72. First interlayer insulating film 71 is arranged so as to cover gate insulating film 15 and gate electrode 27. For example, first interlayer insulating film 71 is made of silicon dioxide. The thickness of first interlayer insulating film 71 is, for example, about 1 μm.

Second interlayer insulating film 72 is arranged on first interlayer insulating film 71. For example, second interlayer insulating film 72 is made of silicon dioxide. The thickness of second interlayer insulating film 72 is, for example, about 1 μm. It should be noted that second interlayer insulating film 72 may be a film having a higher strength than first interlayer insulating film 71. For example, second interlayer insulating film 72 may be a film made of silicon nitride (SiN).

Contact hole SH is a contact hole which penetrates through first interlayer insulating film 71 and second interlayer insulating film 72. In first interlayer insulating film 71, there are formed, in addition to contact hole SH, a contact hole SHa (third contact hole) for exposing Schottky electrode 25 and a contact hole SHb (fourth contact hole) for exposing source region 14 and p+ region 18. Contact holes SHb, GH2 are contact holes penetrating through first interlayer insulating film 71 and gate insulating film 15.

Source electrode 16 is arranged in contact holes SHb, GH2 and is in contact with source region 14 and p+ region 18. Accordingly, source electrode 16 is electrically connected to source region 14 and p+ region 18. Preferably, source electrode 16 is made of a material having nickel and silicon. Source electrode 16 may be made of a material having titanium, aluminum, and silicon. Preferably, source electrode 16 is in ohmic junction with source region 14 and p+ region 18.

Source pad electrode 65 is arranged on first interlayer insulating film 71. Source pad electrode 65 is made of, for example, aluminum. Source pad electrode 65 is electrically connected to Schottky electrode 25 via contact hole SHa. Further, source pad electrode 65 is electrically connected to source electrode 16 via contact holes SHb, SH2.

Gate pad electrode 59 and gate runner 66 are arranged on second interlayer insulating film 72. Gate pad electrode 59 and gate runner 66 are made of, for example, aluminum. However, gate runner 66 is not shown in FIG. 2.

Gate pad electrode 59 is arranged on second interlayer insulating film 72 so as to cover Schottky electrode 25. As shown in FIG. 1, in a plan view, gate pad electrode 59 overlaps Schottky electrode 25.

Gate pad electrode 59 is electrically connected to gate electrode 27 via contact hole SH formed in insulating layer 70 (first interlayer insulating film 71 and second interlayer insulating film 72).

Drain electrode 20 is in contact with second main surface 10b of silicon carbide layer 10. Accordingly, drain electrode 20 is electrically connected to n+ substrate 11. Drain electrode 20 may have the same configuration as, for example, above-described source electrode 16. Alternatively, drain electrode 20 may be made of other material such as nickel capable of being in ohmic junction with n+ substrate 11.

Backside surface protecting electrode 50 is arranged so as to be in contact with drain electrode 20. Backside surface protecting electrode 50 is made of, for example, titanium, nickel, silver, or an alloy of those.

Schottky electrode 25 and source pad electrode 65 are electrically connected to each other, so that a source of the MOSFET and an anode of the SBD are electrically connected. On the other hand, drain electrode 20 is a drain electrode of the MOSFET and is also a cathode of the SBD.

Figure 3:
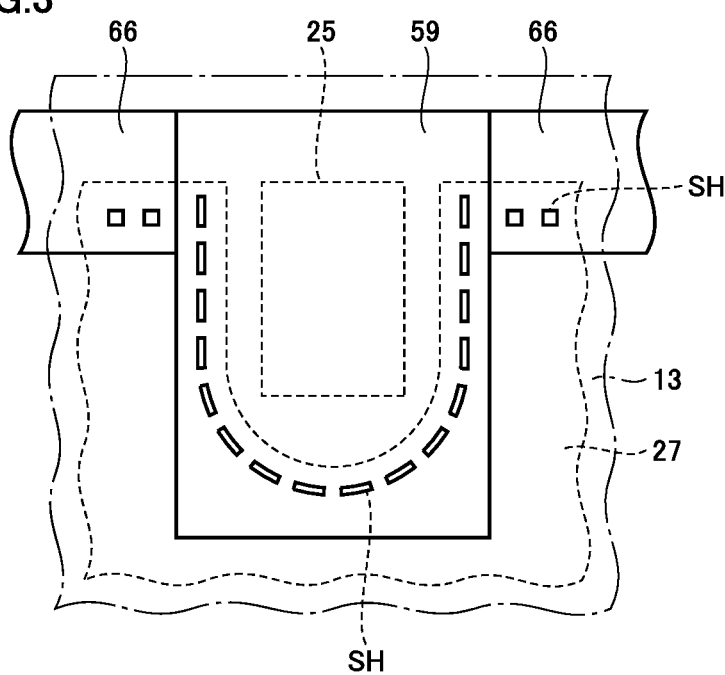
FIG. 3 is a plan view showing an arrangement of a gate pad electrode, a gate electrode, and a Schottky electrode.

FIG. 3 is a plan view showing an arrangement of the gate pad electrode, the gate electrode, and the Schottky electrode. Referring to FIG. 3, in a plan view, gate electrode 27 overlaps gate pad electrode 59 at an outer circumferential portion of gate pad electrode 59. In other words, gate electrode 27 is not formed in a region corresponding to a central portion of gate pad electrode 59.

Gate electrode 27 is electrically connected to gate pad electrode 59 at an outer circumferential portion of gate pad electrode 59. As described above, gate pad electrode 59 is electrically connected to gate electrode 27 via contact hole SH formed in insulating layer 70 (not shown in FIG. 3).

Similarly, gate runner 66 is connected to gate pad electrode 59 and is also connected to gate electrode 27 via contact hole SH.

A capacitor is formed by gate electrode 27, gate insulating film 15 (refer to FIG. 2), and body region 13. As an area of gate electrode 27 increases, a capacity value of the capacitor increases. As the capacity value increases, a delay time of a signal transmitted through gate electrode 27 increases. To avoid such a problem, gate electrode 27 is formed under gate pad electrode 59 so as to have an area which is as small as possible while securing electrical connection with gate pad electrode 59.

Thus, in this embodiment, gate electrode 27 is formed directly under gate pad electrode 59 so as to overlap the outer circumference portion of gate pad electrode 59. Further, gate runner 66 is arranged so as to surround gate electrode 27 and electrically connected to gate electrode 27.

Schottky electrode 25 is arranged on an inner side than gate electrode 27. In a plan view, Schottky electrode 25 is arranged so as to be surrounded by body region 13. In other words, there is not discontinuous portion in body region 13. Thus, generation of a portion having a floating potential in body region 13 can be prevented.

Figure 4:
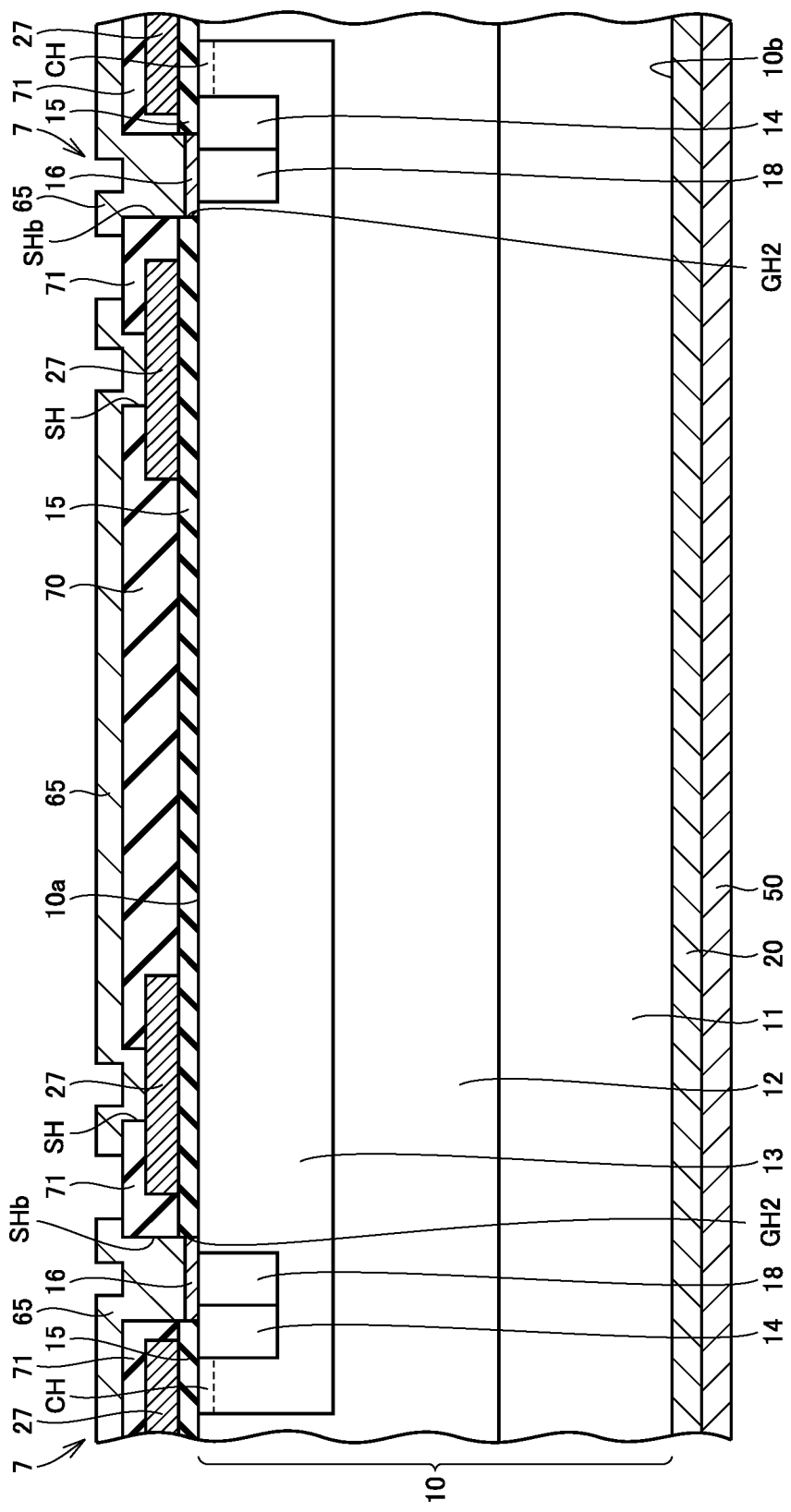
FIG. 4 represents a general structure under a gate pad electrode.

FIG. 4 is a diagram representing a general structure under the gate pad electrode. Referring to FIG. 4, first interlayer insulating film 71 and body region 13 via gate insulating film 15 are present under gate pad electrode 59.

When a reverse bias voltage is applied between the drain and the source of the MOSFET, generation of a high electrical field under gate pad electrode 59 is not desirable in view of protection of elements. Therefore, a portion under gate pad electrode 59 is protected by pn junction formed by drift layer 12 and body region 13.

As shown in FIG. 1, gate pad electrode 59 occupies a relatively large area in the semiconductor chip. However, the MOSFET is not formed in the region directly under gate pad electrode 59.

For example, during a test of a silicon carbide semiconductor device, there is a case where a probe needle comes in contact with a gate pad electrode. Moreover, in a wire bonding step, a wire is connected to a gate pad electrode. In these cases, a relatively great force is applied to gate pad electrode 59. When an element is produced in a region under gate pad electrode 59, it is concerned that a shock applied to the gate pad electrode causes a damage on the element. Therefore, in the structure shown in FIG. 4, an element such as a MOSFET is not formed under gate pad electrode 59.

On the other hand, in this embodiment, Schottky electrode 25 is formed under gate pad electrode 59. Accordingly, the SBD is formed under gate pad electrode 59. As described above, the region under gate pad electrode 59 is a region in which a transistor element is not formed. By forming the SBD in this region, reduction of the active region can be prevented. Since the SBD is constituted of Schottky electrode 25 and silicon carbide layer 10, a structure is simple. Thus, arrangement of the SBD under gate pad electrode 59 can be achieved.

As described above, when an element is produced in the region under gate pad electrode 59, it is concerned that a shock applied to the gate pad electrode causes a damage on the element. In this embodiment, two interlayer insulating films 71, 72 are stacked between gate pad electrode 59 and Schottky electrode 25. Thus, the SBD formed under gate pad electrode 59 can be protected from a shock applied to gate pad electrode 59.

Figure 5:
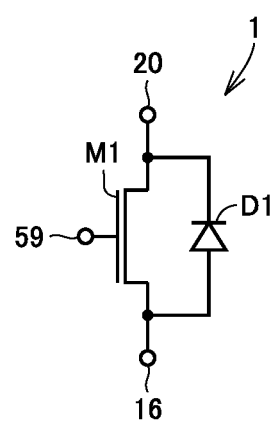
FIG. 5 is a representative circuit diagram of silicon carbide semiconductor device 1 in accordance with the first embodiment.

FIG. 5 is a representative circuit diagram of silicon carbide semiconductor device 1 in accordance with the first embodiment. Referring to FIG. 5, silicon carbide semiconductor device 1 has an MOS transistor M1 and a Schottky barrier diode D1.

MOS transistor M1 represents integrated transistor element 7. A drain electrode of MOS transistor M1 and a cathode electrode of Schottky barrier diode D1 are electrically connected to each other. The drain electrode of MOS transistor M1 and the cathode electrode of Schottky barrier diode D1 are achieved by drain electrode 20.

A source electrode of MOS transistor M1 and an anode electrode of Schottky barrier diode D1 are electrically connected to each other. The source electrode of MOS transistor M1 is achieved by source electrode 16 (and source pad electrode 65) shown in FIG. 2. On the other hand, the anode electrode of Schottky barrier diode D1 is achieved by Schottky electrode 25. This Schottky electrode 25 is electrically connected to a source of the MOSFET via source electrode 16 and source pad electrode 65.

Figure 6:
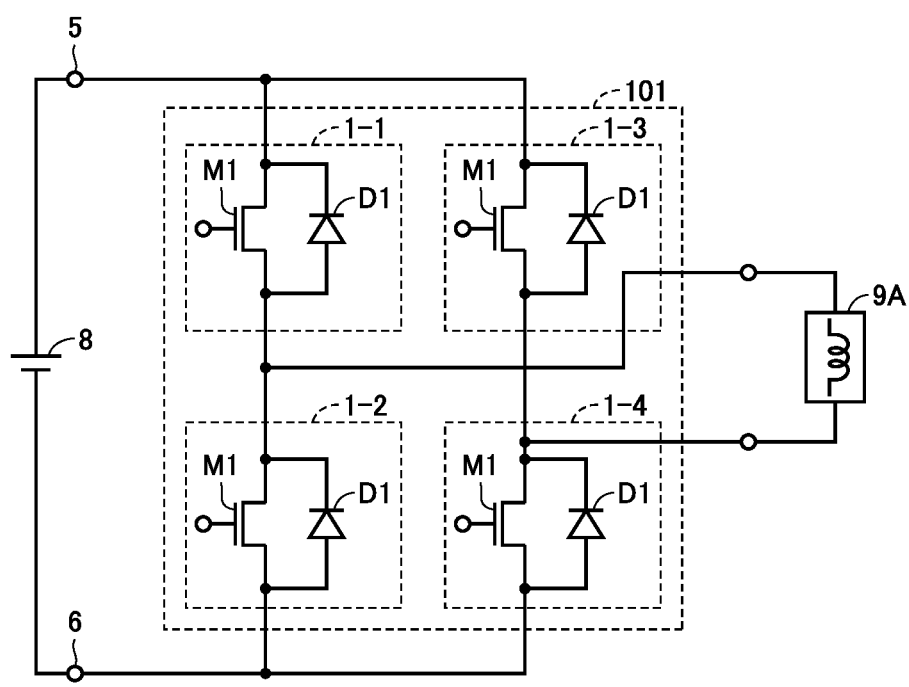
FIG. 6 is a circuit diagram representing one example of an inverter circuit constituted of silicon carbide semiconductor device 1 in accordance with the first embodiment.

FIG. 6 is a circuit diagram showing one example of an inverter circuit constituted of silicon carbide semiconductor device 1 in accordance with the first embodiment. Referring to FIG. 6, inverter circuit 101 is, for example, a single-phase inverter. Inverter circuit 101 is connected to a positive electrode and a negative electrode of a DC power supply 8 via a positive electrode terminal 5 and a negative electrode terminal 6. Inverter circuit 101 converts direct current power supplied from DC power supply 8 into a single-phase alternate current. A single-phase load 9A is an inductive load, which is a single-phase motor, for example. However, a kind of single-phase load 9A is not particularly limited.

Inverter circuit 101 includes silicon carbide semiconductor devices 1-1 to 1-4. A configuration of each of silicon carbide semiconductor devices 1-1 to 1-4 is the same as the configuration shown in FIG. 5. Thus, each of silicon carbide semiconductor devices 1-1 to 1-4 can be achieved with silicon carbide semiconductor device 1 in accordance with this embodiment.

Silicon carbide semiconductor devices 1-1, 1-2 are connected in series between positive electrode terminal 5 and negative electrode terminal 6. Similarly, silicon carbide semiconductor devices 1-3, 1-4 are connected in series between positive electrode terminal 5 and negative electrode terminal 6.

It should be noted that inverter circuit 101 may be a three-phase inverter. In this case, two silicon carbide semiconductor devices connected in series between positive electrode terminal 5 and negative electrode terminal 6 may be added to the configuration shown in FIG. 6.

At the time of switching a load including an inductance component, in other words, an inductive load, a large current like a surge current may be generated. This surge current may cause a damage on a MOS transistor. To avoid a damage on the MOS transistor, a freewheel diode is connected to the MOS transistor in reverse parallel.

In many examples, the freewheel diode is achieved by a chip other than the MOS transistor, or achieved by a discrete device. On the other hand, in this embodiment, the MOS transistor and the SBD are integrated in one semiconductor chip. Thus, the inverter circuit can be achieved with a small and simple configuration. Thus, a system which is superior in cost can be constructed.

When the SBD is arranged in a region where transistor element 7 is integrated (which is referred to as an element region), the number of transistor elements arranged in the element region is reduced. In other words, an area of the active region of the silicon carbide semiconductor device is reduced.

According to this embodiment, the SBD is formed in the region under gate pad electrode 59. While the region under gate pad electrode 59 has a relatively large area, the transistor element is not formed. Thus, by forming the SBD in this region, reduction of the active region can be avoided.

Further, according to this embodiment, a plurality of openings 30a are formed in body region 13, and Schottky electrode 25 is Schottky functioned to drift layer 12 at each of the plurality of openings 30a. Accordingly, since the SBD having a sufficient size can be achieved, more current can be provided by means of the SBD.

Second Embodiment

Figure 7:
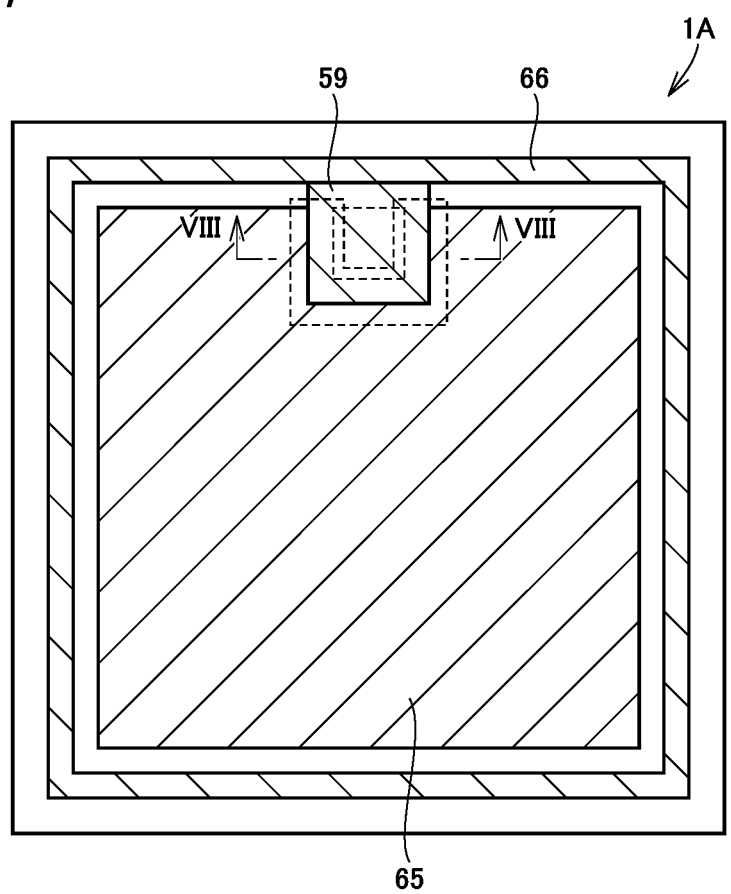
FIG. 7 is a plan view schematically showing a configuration of a silicon carbide semiconductor device 1A in accordance with a second embodiment of the present invention.

FIG. 7 is a plan view schematically showing a configuration of silicon carbide semiconductor device 1A in accordance with a second embodiment of the present invention. Referring to FIGS. 1 and 7, a configuration of silicon carbide semiconductor device 1A is basically the same as that of silicon carbide semiconductor device 1 in accordance with the first embodiment. Silicon carbide semiconductor device 1A in accordance with the second embodiment differs from silicon carbide semiconductor device 1 in accordance with the first embodiment in the arrangement of the Schottky electrode. Hereinafter, this point will be described in detail.

Figure 8:
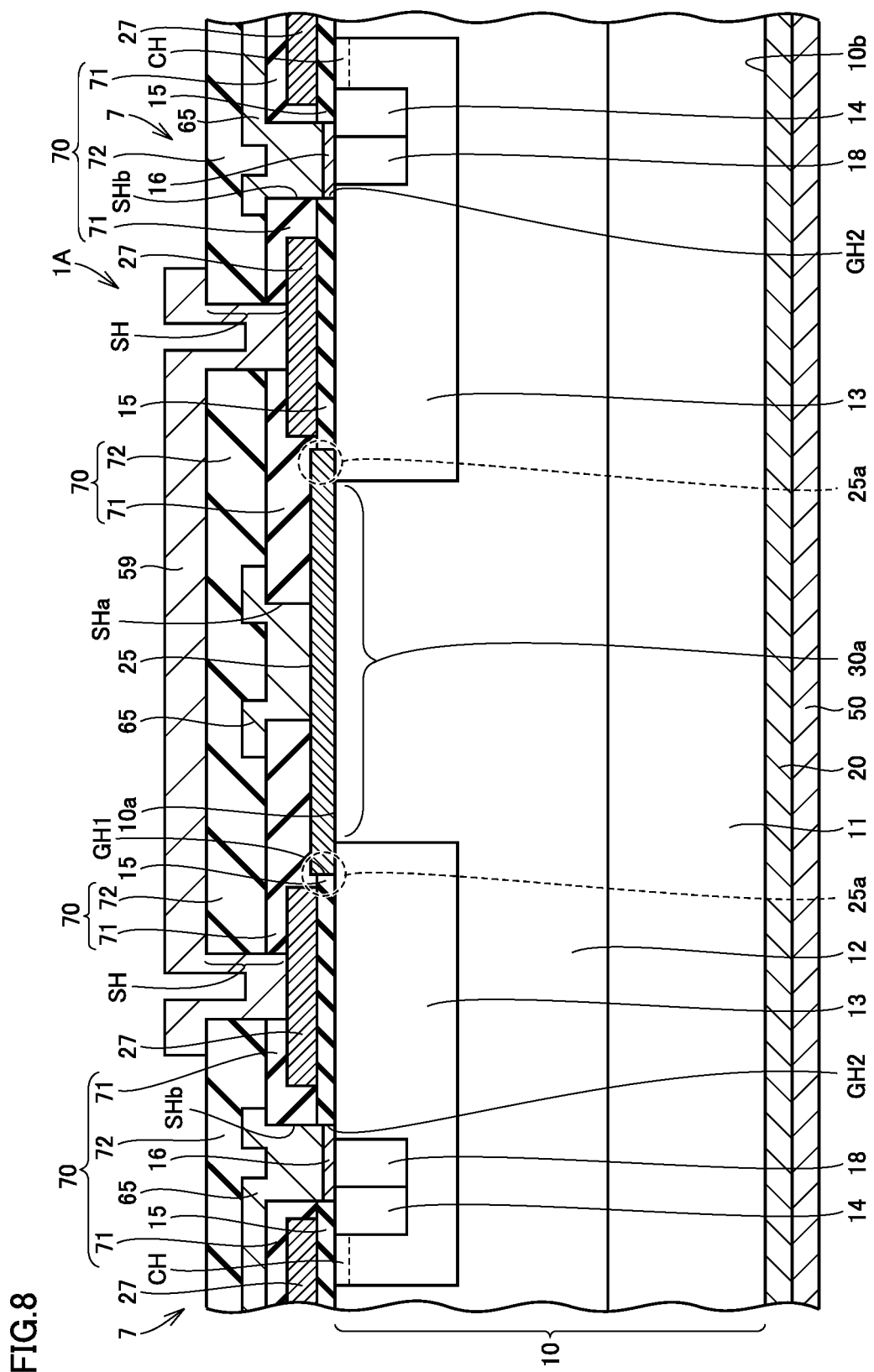
FIG. 8 is a partial cross sectional view of silicon carbide semiconductor device 1A taken along the VIII-VIII line of FIG. 7.

FIG. 8 is a partial cross sectional view of silicon carbide semiconductor device 1A taken along the VIII-VIII line of FIG. 7. Referring to FIGS. 7 and 8, Schottky electrode 25 is arranged so as to cover both of drift layer 12 and body region 13. In other words, opening (30a) is arranged inside of first contact hole (GH1).

An end portion 25a of Schottky electrode 25 covers body region 13. Thus, Schottky electrode 25 is Schottky functioned to both of body region 13 and drift layer 12.

It should be noted that the arrangement of Schottky electrode 25 (in other words, opening 30a) in the second embodiment is the same as the arrangement shown in FIG. 3.

According to the second embodiment, the same effect as that of the first embodiment can be achieved. Particularly, according to the second embodiment, Schottky electrode 25 is Schottky functioned not only to drift layer 12 but also to body region 13.

With this configuration, the switching characteristics of silicon carbide semiconductor device 1A can be improved. Accordingly, a breakdown voltage of silicon carbide semiconductor device 1A can be raised. This effect will be described in detail with reference to the drawings.

Figure 9:
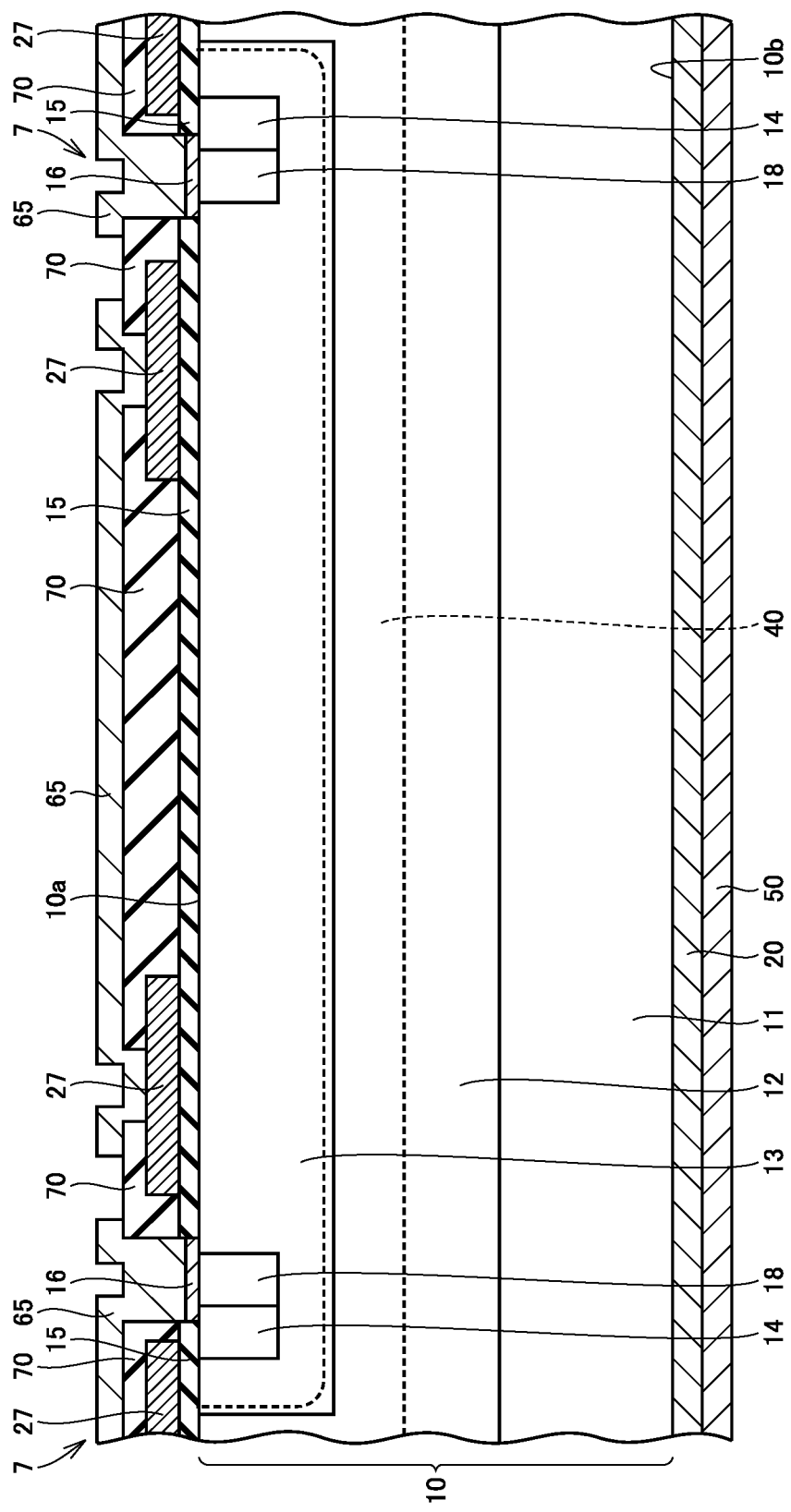
FIG. 9 is a cross sectional view schematically showing a sate in which a reverse bias voltage is applied between the drain electrode and the source pad electrode in the configuration shown in FIG. 4.

FIG. 9 is a cross sectional view schematically showing a state in which a reverse bias voltage is applied between the drain electrode and the source pad electrode in the configuration shown in FIG. 4. Referring to FIG. 9, when the MOSFET (transistor element 7) is in an off-state, a voltage is applied between drain electrode 20 and source pad electrode 65 so that an electric potential of drain electrode 20 becomes higher than an electric potential of source pad electrode 65. Such a state may occur during an operation of inverter circuit 101 shown in FIG. 6. In this case, a depletion layer 40 expands from a boundary surface (joining portion) between drift layer 12 and body region 13.

When the switching speed of the MOSFET increases, there is a possibility that a positive hole cannot be taken in and out sufficiently with respect to the p-type region. Therefore, there is a possibility that smooth switching between depletion and release of depletion of the pn junction becomes difficult. In such a case, the switching speed of the MOSFET must be decreased.

In the configuration shown in FIG. 4, source pad electrode 65 cannot be arranged under gate pad electrode 59. Thus, body region 13 is connected to source pad electrode 65 in a circumference of gate pad electrode 59. An electron hole is implanted and drawn out with respect to body region 13 by p+ region 18 and source pad electrode 65. However, a portion of body region 13 under gate pad electrode 59 is relatively apart from the position where source pad electrode 65 and body region 13 are electrically connected (in other words, the position of p+ region 18).

In order to deplete body region 13 under gate pad electrode 59, it is necessary to move an electron hole to source pad electrode 65 connected to body region 13 in a circumference of gate pad electrode 59. Therefore, a time required to deplete body region 13 is lengthened. On the contrary, in order to release depletion of body region 13, an electron hole must be implanted from the circumference of gate pad electrode 59 via source pad electrode 65. Therefore, a time required to release depletion of body region 13 is also lengthened.

Lengthening the depletion and the release of depletion of body region 13 becomes a factor which causes the improvement in the switching speed of the MOSFET to be difficult. When a long time is taken to deplete the pn junction, a bias voltage is likely to be applied to the pn junction while the depletion layer is not sufficiently expanded. In this case, since the intensity of the electric field in the depletion is raised, there is a possibility that a sufficient breakdown voltage cannot be secured.

In order to solve this problem, raising the impurity concentration of body region 13 may be considered. However, since the depletion layer becomes less likely to be expanded to the side of body region 13, there is a possibility that the breakdown voltage of transistor element 7 is lowered. Moreover, in a silicon carbide semiconductor, when an insulating film is formed with an oxide film on a surface of the p-type region, the reliability of the oxide film is likely to be lowered as the impurity concentration of the p-type region becomes higher.

Figure 10:
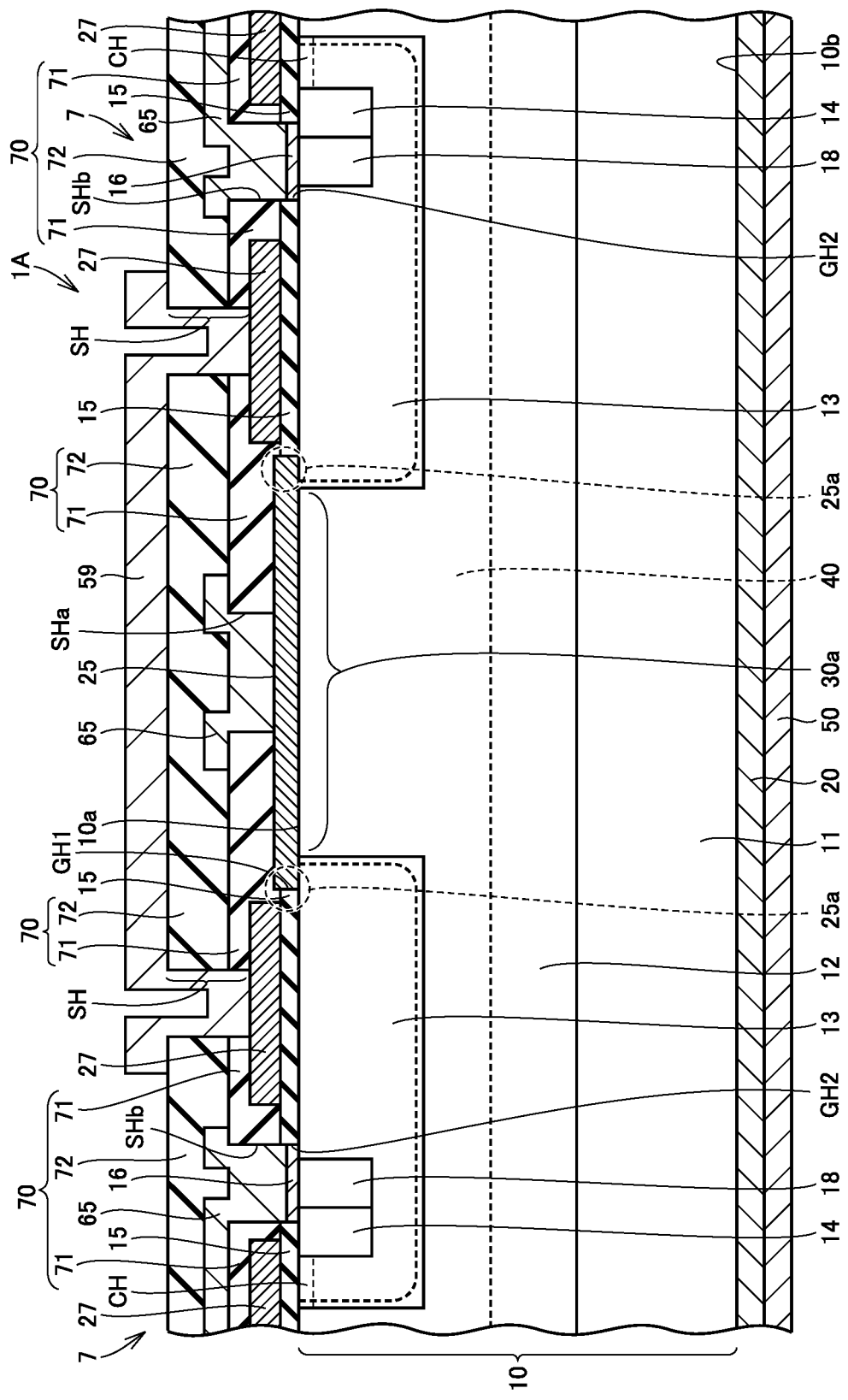
FIG. 10 is a cross sectional view schematically showing a state in which a reverse bias voltage is applied to silicon carbide semiconductor device 1A in accordance with the second embodiment.

FIG. 10 is a cross sectional view schematically showing a state in which a reverse bias voltage is applied to silicon carbide semiconductor device 1A in accordance with the second embodiment. Referring to FIG. 10, according to this embodiment, an electron hole is implanted from Schottky electrode 25. Accordingly, even without raising the impurity concentration of body region 13, depletion of a portion of body region 13 under gate pad electrode 59 can be released in a short time.

On the other hand, when a reverse bias is applied to the SBD and the MOSFET, an electric potential of Schottky electrode 25 becomes lower than an electric potential of drain electrode 20. In this case, an electron is drawn out from drift layer 12 by drain electrode 20. On the other hand, an electron hole is drawn out from body region 13 by source pad electrode 65 and Schottky electrode 25. A portion of body region 13 under gate pad electrode 59 can be depleted in a shorter time by Schottky electrode 25. By expanding depletion layer 40 as early as possible, the intensity of the electric field applied to depletion layer 40 can be lowered. Thus, a breakdown voltage of silicon carbide semiconductor device 1A (MOSFET) can be improved.

Third Embodiment

Figure 11:
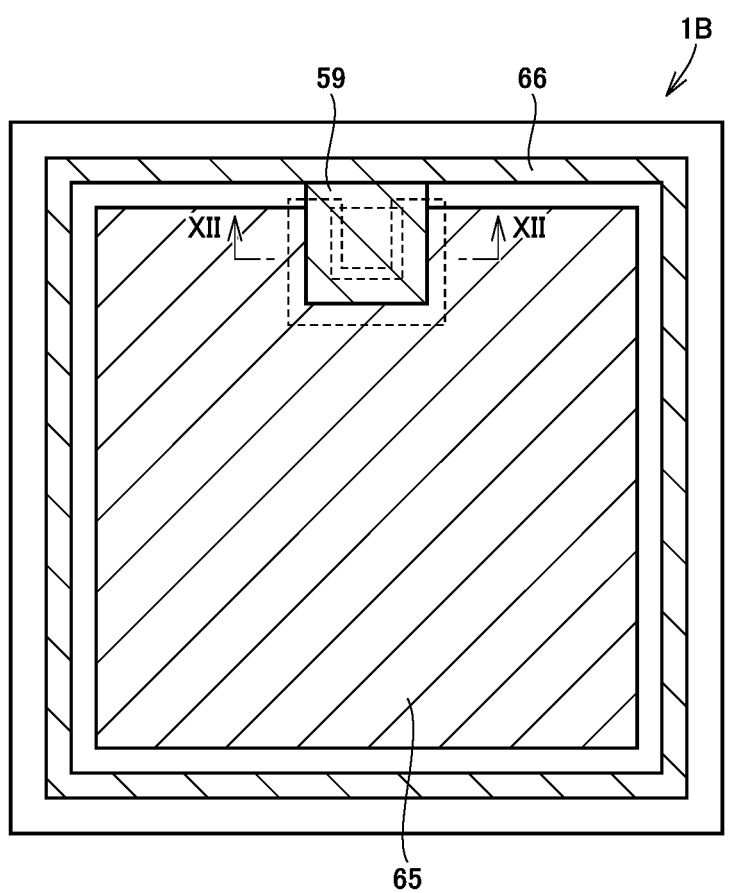
FIG. 11 is a plan view schematically showing a configuration of a silicon carbide semiconductor device 1B in accordance with a third embodiment of the present invention.

FIG. 11 is a plan view schematically showing a configuration of silicon carbide semiconductor device 1B in accordance with a third embodiment of the present invention. Referring to FIGS. 1 and 11, the configuration of silicon carbide semiconductor device 1B is basically the same as silicon carbide semiconductor device 1 in accordance with the first embodiment. Silicon carbide semiconductor device 1B in accordance with the third embodiment is different from silicon carbide semiconductor device 1 in accordance with the third embodiment in the cross sectional shape of the SBD. Hereinafter, this point will be described in detail.

Figure 12:
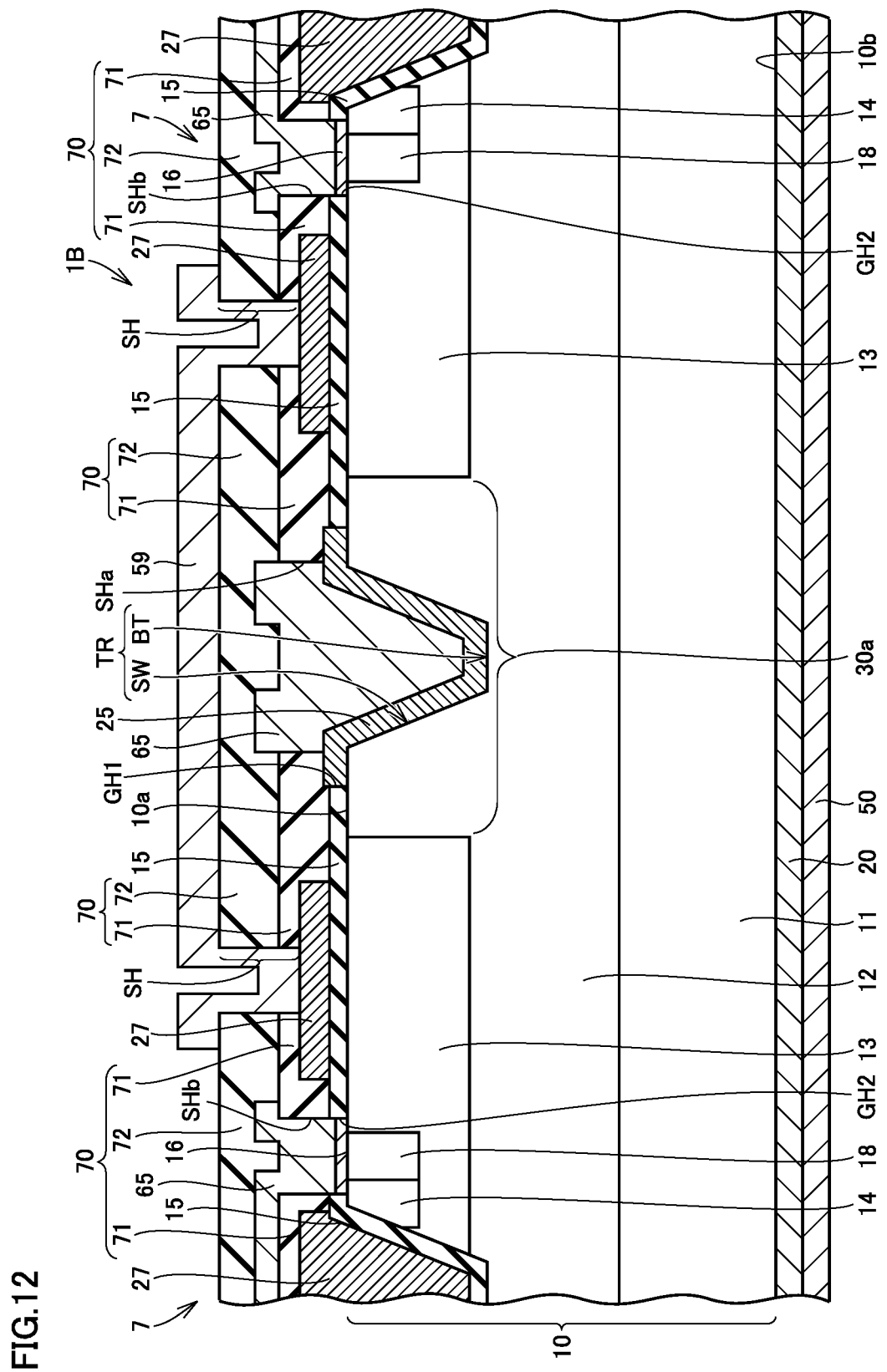
FIG. 12 is a partial cross sectional view taken along the XII-XII line of FIG. 11.

FIG. 12 is a partial cross sectional view taken along the XII-XII line of FIG. 11. Referring to FIGS. 11 and 12, opening 30a has a trench (trench TR). Trench TR has a side wall plane SW and a bottom surface BT. In other words, opening 30a has side wall plane SW and bottom surface BT.

Side wall plane SW is a plane which inclines with respect to main surface 10a of silicon carbide layer 10 so as to come close to main surface 10b of silicon carbide layer 10. In other words, two side wall planes SW opposite to each other are widened in a tapered manner toward first main surface 10a of silicon carbide layer 10.

Side wall plane SW is a plane which inclines, for example, with respect to a {000-1} plane by an angle greater than or equal to 50 degrees and less than or equal to 80 degrees. More specifically, side wall plane SW has any of plane orientations {0-33-8}, {0-11-2}, {0-11-4}, and {0-11-1} in a macroscopic view. It should be noted that the term "macroscopic" means that a fine structure having a size of inter-atomic spacing is disregarded. For example, a method using a general X-ray diffraction may be used as a macroscopic measurement of an off angle.

Such opening 30a (trench TR) can be formed by, for example, thermal etching. In the present specification, the "thermal etching" is an etching processing which is performed by exposing a subject to be etched to etching gas under a high temperature, and is a processing which substantially does not have a physical etching effect. Process gas of the thermal etching contains halogen element. More preferably, the halogen element is chlorine or fluorine. Specifically, process gas containing at least any of $Cl_2$, $BCl_3$, $CF_4$, and $SF_6$ can be used as the process gas, and $Cl_2$ is particularly favorable for use.

Moreover, the process gas preferably contains oxygen gas. Moreover, the process gas may contain carrier gas. The carrier gas may be, for example, nitrogen gas, argon gas, or helium gas.

A heat treatment temperature of the thermal etching is preferably higher than or equal to 700° C. and lower than or equal to 1200° C. A lower limit of this temperature is more preferably 800° C., and yet more preferably 900° C. Accordingly, the etching speed can be set to a sufficiently practical value. Moreover, an upper limit of this temperature is more preferably 1100° C., yet more preferably 1000° C. When the heat treatment temperature is set to be higher than or equal to 700° C. and lower than or equal to 1000° C., the etching speed of SiC becomes, for example, 70 μm/hr.

Figure 15:
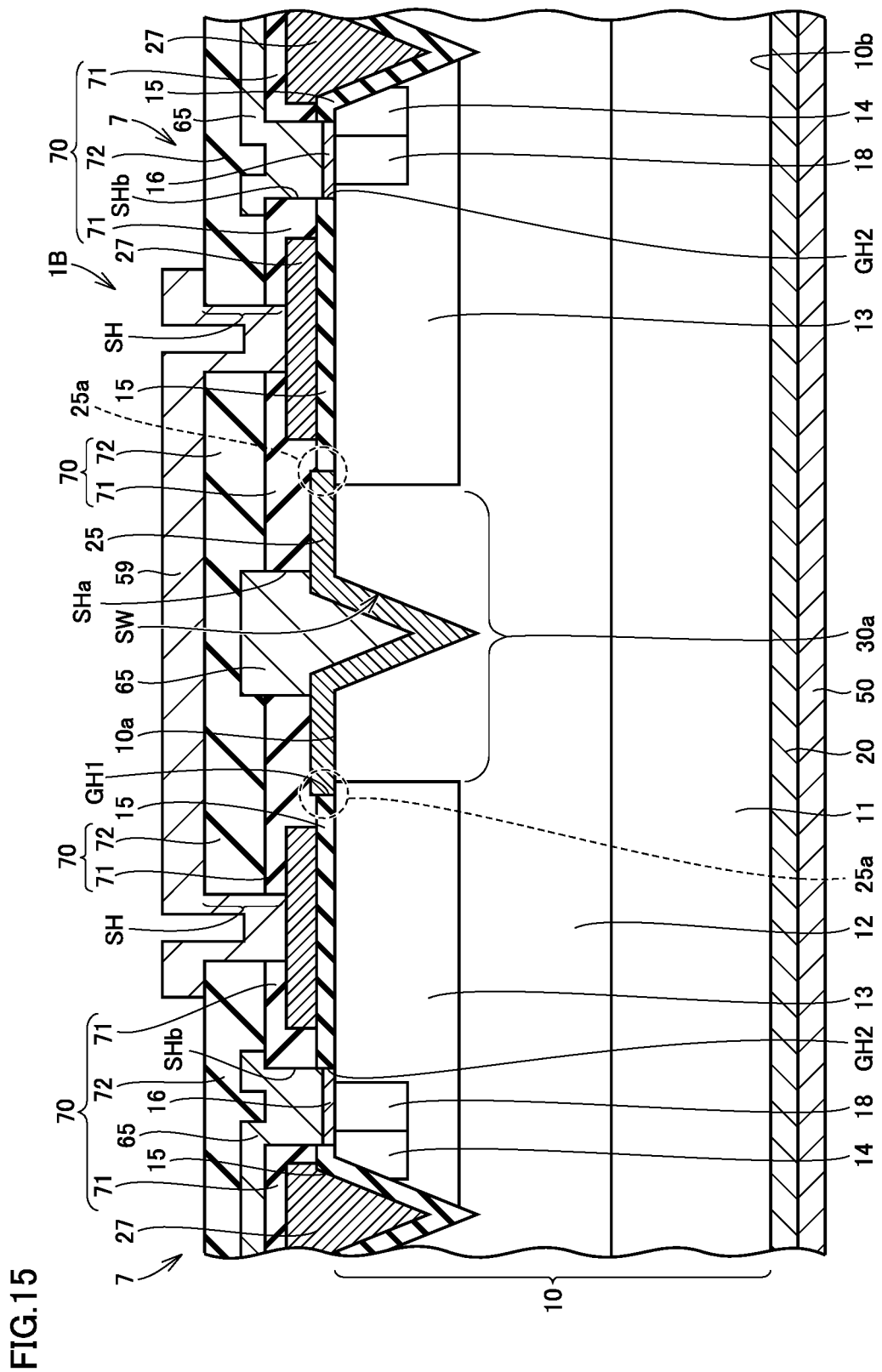
FIG. 15 represents yet another configuration of the silicon carbide semiconductor device in accordance with the third embodiment.

Schottky electrode 25 is arranged so as to cover an inner circumferential surface of trench TR (side wall plane SW and bottom surface BT). It should be noted that, as shown in FIG. 15, opening 30*a* may be filled with Schottky electrode 25.

According to the third embodiment, the same effect as the first embodiment can be achieved. Particularly, according to the third embodiment, an area of Schottky electrode 25 being Schottky functioned to drift layer 12 can be increased. Thus, more carrier can be implanted and drawn out via the Schottky electrode.

When a current flows in the forward direction to the SBD, more carrier (electron) can be implanted from Schottky electrode 25 to drift layer 12. Accordingly, depletion in drift layer 12 can be released promptly.

When a reverse bias is applied to the SBD and transistor element 7, more electron holes can be drawn out from body region 13 by Schottky electrode 25. Accordingly, depletion layer 40 can be widened more promptly.

Figure 13:
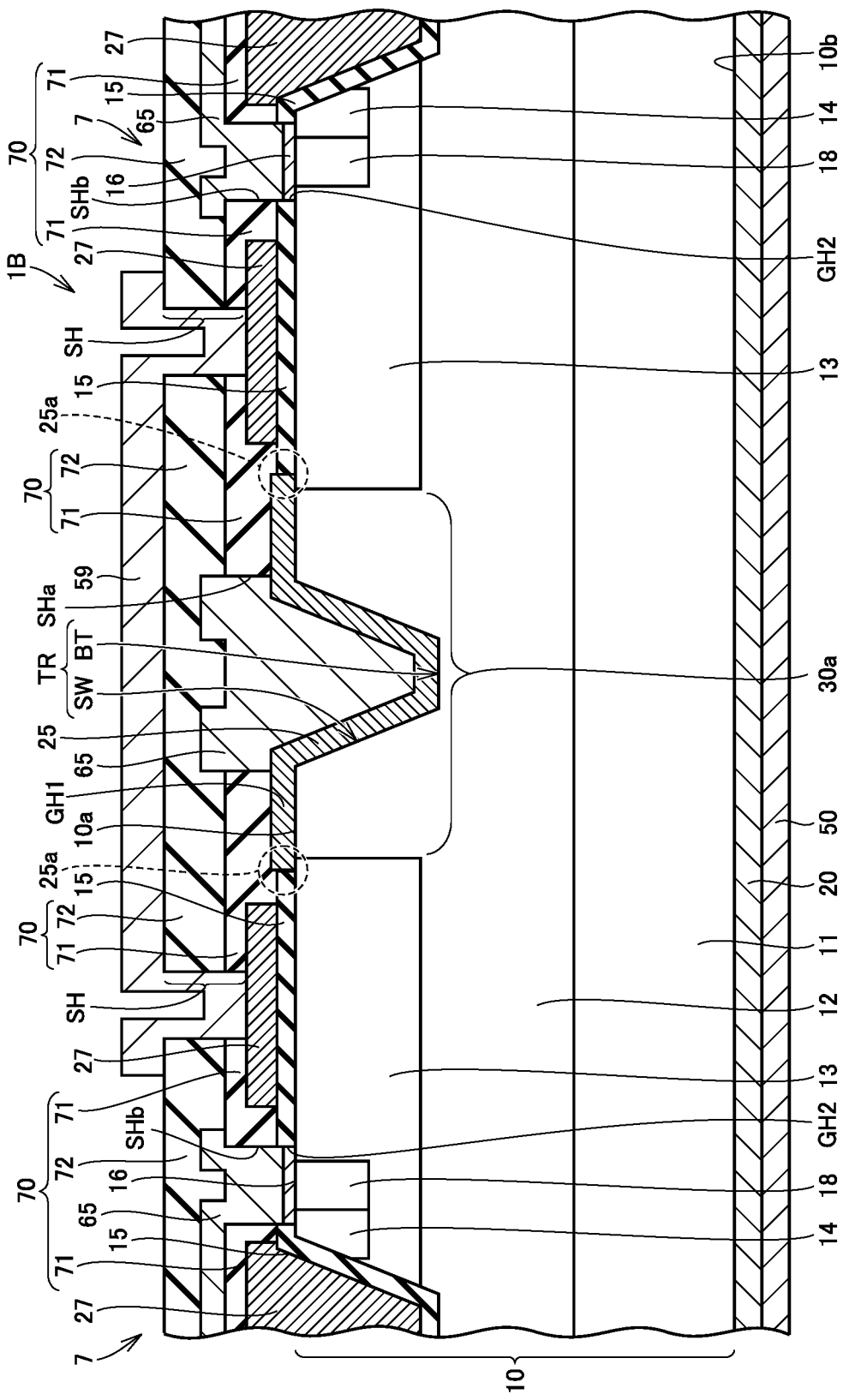
FIG. 13 is a cross sectional view showing another configuration of silicon carbide semiconductor device 1B in accordance with the third embodiment.

FIG. 13 is a cross sectional view representing another configuration of silicon carbide semiconductor device 1B in accordance with the third embodiment. Referring to FIG. 13, an end portion 25*a* of Schottky electrode 25 covers body region 13. At end portion 25*a* of Schottky electrode 25, Schottky electrode 25 is Schottky functioned to body region 13. Accordingly, when a reverse bias is applied to the SBD and the transistor element, electron holes can be drawn out more promptly from body region 13. On the other hand, when a forward bias is applied to the SBD, depletion of body region 13 and the drift region can be released earlier.

Figure 14:
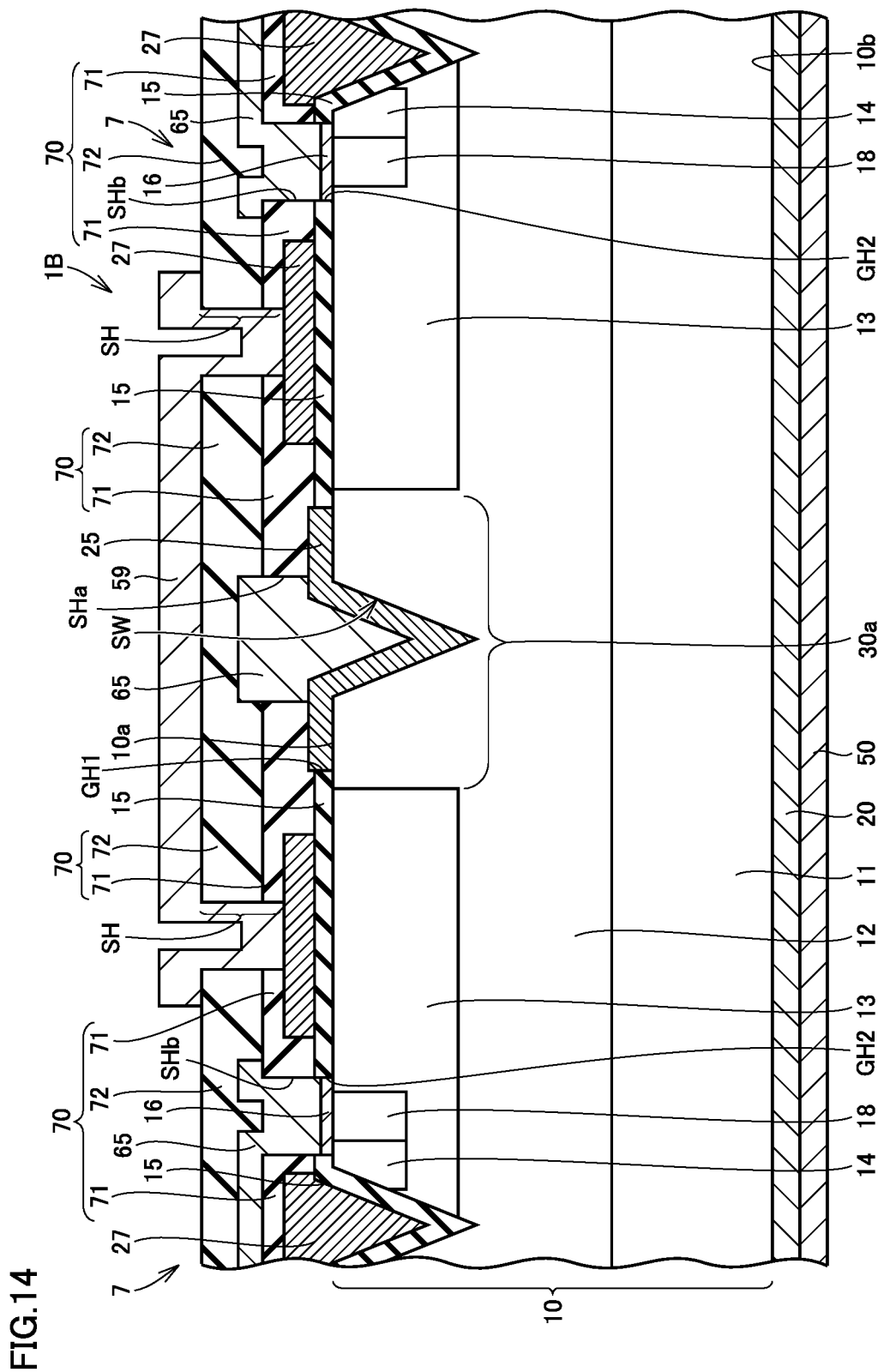
FIG. 14 represents yet another configuration of the silicon carbide semiconductor device in accordance with the third embodiment.

FIG. 14 represents yet another configuration of the silicon carbide semiconductor device in accordance with the third embodiment. Referring to FIG. 14, bottom surface BT may be omitted from opening 30*a*. In other words, a cross sectional shape of opening 30*a* may be a V-shape. According to such a configuration, the size of opening 30*a* can be decreased.

FIG. 15 represents yet another configuration of the silicon carbide semiconductor device in accordance with the third embodiment. Referring to FIG. 15, bottom surface BT is omitted from opening 30*a*. Further, end portion 25*a* of Schottky electrode 25 covers body region 13. According to this configuration, the size of the SBD can be reduced. Further, as with the structure shown in FIG. 13, when a reverse bias is applied to the SBD and the transistor element, an electron hole can be drawn out earlier. Thus, depletion layer 40 can be further widened. By widening depletion layer 40 earlier, a breakdown voltage can be further improved. On the other hand, when a forward bias is applied to the SBD, depletion of body region 13 and the drift region can be released earlier.

Further, arrangement of Schottky electrode 25 in a plan view (a planar layout of Schottky electrode 25) is not limited to the arrangement shown in FIG. 3.

Figure 16:
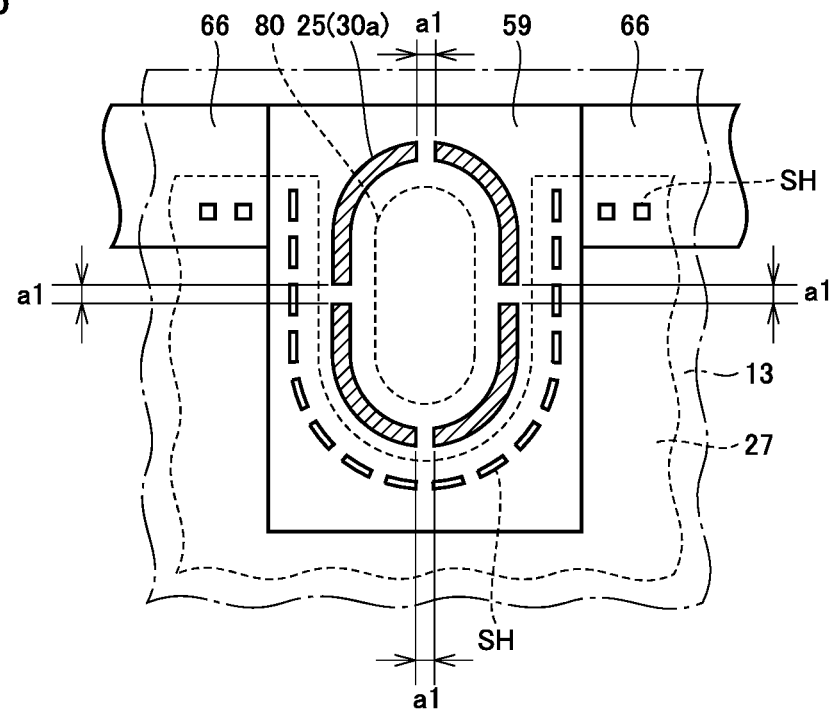
FIG. 16 is a plan view showing another embodiment of an arrangement of a Schottky electrode 25.

FIG. 16 is a plan view showing another embodiment of the arrangement of Schottky electrode 25. Referring to FIG. 16, Schottky electrode 25 and opening 30*a* overlap each other. A plurality of Schottky electrodes 25 (in other words, a plurality of openings 30*a*) are, in a plan view, arranged so as to be located on an inner side than gate electrode 27 and surround a central portion 80 of gate pad electrode 59. Central portion 80 is a region of gate pad electrode 59 to which a non-illustrated wire is connected.

For example, at the time of wire bonding, there is a possibility that a strong force is applied to central portion 80. According to FIG. 16, a plurality of Schottky electrodes 25 are arranged so as to avoid central portion 80 of gate pad electrode 59. Accordingly, the possibility of causing a damage on the SBD due to a shock to gate pad electrode 59 can be further reduced.

A plurality of Schottky electrodes 25 (in other words, openings 30*a*) are separated by a fixed space a1. Drift layer 12 is exposed at openings 30*a*. A region directly under opening 30*a* is an n-type region. Therefore, when one continuous (in other words, without a gap) opening is formed in body region 13, body region 13 is divided into a region on an inner side than the openings and a region on an outer side than the openings.

The region on an outer side than the opening is applied with an electric potential by source electrode 16 and source pad electrode 65. On the other hand, an electric potential of a region on an inner side than the openings becomes a floating electric potential. By arranging a plurality of opening with a space, these two regions are electrically connected. Thus, it can prevent an electric potential of a region on an outer side than the openings from being a floating electric potential.

Figure 17:
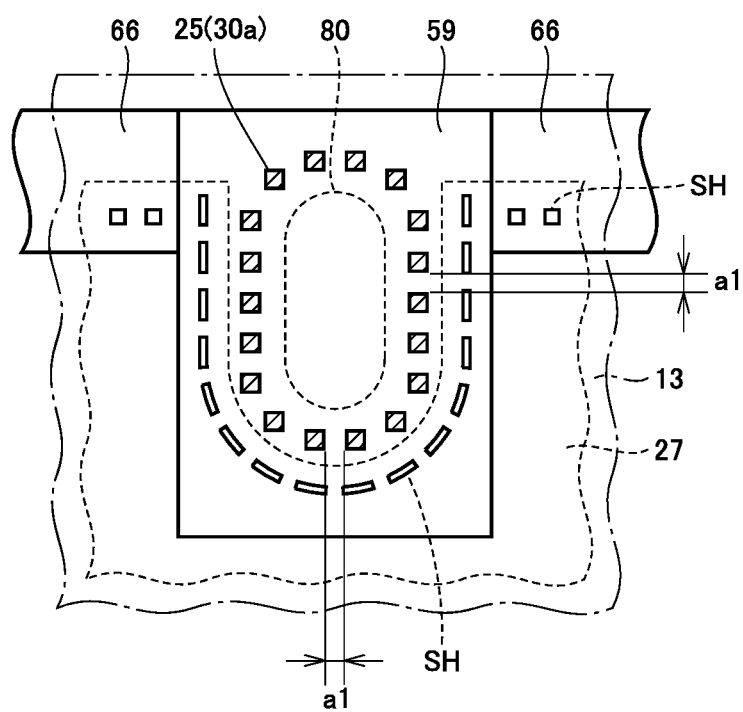
FIG. 17 is a plan view showing yet another embodiment of an arrangement of Schottky electrode 25.

FIG. 17 is a plan view showing yet another embodiment of the arrangement of Schottky electrodes 25. Schottky electrodes 25 (openings 30*a*) shown in FIG. 17 are smaller than Schottky electrodes 25 (openings 30*a*) shown in FIG. 16. Accordingly, since the number of Schottky electrodes 25 (openings 30*a*) increases, the portion of gaps also increase. Thus, an electric potential difference between the region inside of the plurality of openings 30*a* and the region outside of the plurality of openings 30*a* can be further reduced.

It should be noted that the plurality of Schottky electrodes 25 are not limited to surround central portion 80 by a single line. The plurality of Schottky electrode 25 may surround central portion 80 by double lines.

Moreover, the number of openings 30*a* may be single. Also in this case, in order to avoid an electric potential of the region on an inner side than opening 30*a* from being a floating electric potential, opening 30*a* is all necessary to have a gap.

Moreover, in the embodiment described above, the MOSFET was illustrated as a transistor arranged in a silicon carbide semiconductor device. However, the transistor element arranged in the silicon carbide semiconductor device in accordance with this embodiment is all necessary to have the drift region and the body region. Thus, the transistor element may be, for example, an IGBT (Insulated Gate Bipolar Transistor) or the like.

Moreover, in the embodiment described above, silicon carbide layer 10 has n+ substrate 11 and n-type drift layer 12. Silicon carbide layer 10 as a whole is a layer of n-type silicon carbide. In other words, in the embodiment described above, the first conductivity type which is a conductivity type of silicon carbide layer 10 is n-type, and the second conductivity type which is a conductivity type of body region 13 is p-type. By forming the p-type region in the n-type silicon carbide layer, easiness in manufacturing a silicon carbide semiconductor device can be improved. However, the first conductivity type may be p-type, and the second conductivity type may be n-type.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST 1, 1A, 1B silicon carbide semiconductor device; 5 positive electrode terminal; 6 negative electrode terminal; 7 transistor element; 8 DC power supply; 9A single-phase load; 10 silicon carbide layer; 10a first main surface; 10b second main surface; 11 n+ substrate; 12 drift layer; 13 body region; 14 source region; 15 gate insulating film; 16 source electrode; 18 p+ region; 20 drain electrode; 25 Schottky electrode; 25a end portion (Schottky electrode); 27 gate electrode; 30a opening; 40 depletion layer; 50 backside surface protecting electrode; 59 gate pad electrode; 65 source pad electrode; 66 gate runner; 70 insulating layer; 71 first interlayer insulating film; 72 second interlayer insulating film; 80 central portion (gate pad electrode); 101 inverter circuit; BT bottom surface; CH channel region; D1 Schottky barrier diode; GH1, GH2, SH, SHa, SHb contact hole; M1 MOS transistor; SW side wall plane; TR trench; a1 space.

The invention claimed is:

1. A silicon carbide semiconductor device comprising:
a silicon carbide layer having a first main surface and a second main surface located on a side opposite to the first main surface,
the silicon carbide layer including:
a drift layer having a first conductivity type and defining the first main surface of the silicon carbide layer; and
a body region being provided on the drift layer, having a second conductivity type different from the first conductivity type, and being provided with at least one opening for exposing the drift layer,
the silicon carbide semiconductor device including:
a gate insulating film being arranged on the first main surface of the silicon carbide layer and having a first contact hole for exposing the first main surface on the at least one opening;
a Schottky electrode being Schottky functioned to the drift layer via the first contact hole and the at least one opening;
a gate electrode being arranged on the gate insulating film;
an insulating layer being arranged so as to cover the gate insulating film, the gate electrode, and the Schottky electrode and having a second contact hole for exposing the gate electrode; and
a gate pad electrode being arranged on the insulating layer so as to overlap the Schottky electrode in a plan view and electrically connected to the gate electrode via the second contact hole.

2. The silicon carbide semiconductor device according to claim 1, wherein
the at least one opening is arranged inside of the first contact hole, and
the Schottky electrode is Schottky functioned to both of the drift layer and the body region.

3. The silicon carbide semiconductor device according to claim 1, wherein
the silicon carbide layer further includes:
a first region being arranged in the body region and having the first conductivity type; and
a second region being arranged in the body region and having the second conductivity type,
the insulating layer includes:
a first interlayer insulating film being arranged so as to cover the gate insulating film and the gate electrode and having a third contact hole for exposing the Schottky electrode and a fourth contact hole for exposing the first and second regions; and
a second interlayer insulating film arranged on the first interlayer insulating film,
the silicon carbide semiconductor device further comprising:
a source pad electrode being arranged on the first interlayer insulating film, being electrically connected to the Schottky electrode via the third contact hole, and being electrically connected to the first and second regions through the fourth contact hole.

4. The silicon carbide semiconductor device according to claim 1, wherein
the at least one opening is a plurality of openings separated by a space, and
the gate electrode is electrically connected to the gate pad electrode at an outer circumference portion of the gate pad electrode, and
in a plan view, the plurality of openings are located on an inner side than the gate electrode and arranged so as to surround a central portion of the gate pad electrode.

5. The silicon carbide semiconductor device according to claim 4, wherein a length of the space between the plurality of openings is fixed.

6. The silicon carbide semiconductor device according to claim 1, wherein
the at least one opening has a trench penetrating through the body region to reach the drift layer, and
the Schottky electrode is arranged so as to cover an inner circumferential surface of the trench.

7. The silicon carbide semiconductor device according to claim 1, wherein
the first conductivity type is n-type, and
the second conductivity type is p-type.

* * * * *

UNITED STATES PATENT AND TRADEMARK OFFICE
CERTIFICATE OF CORRECTION

PATENT NO. : 9,627,525 B2
APPLICATION NO. : 15/021624
DATED : April 18, 2017
INVENTOR(S) : Hiyoshi et al.

It is certified that error appears in the above-identified patent and that said Letters Patent is hereby corrected as shown below:

On the Title Page

Item (57) Abstract, Line 6, replace "Schottky functioned" with --Schottky-junctioned--.

In the Specification

Column 2, Line 13, replace "Schottky functioned" with --Schottky-junctioned--.

Column 3, Lines 63-64, replace "Schottky functioned" with --Schottky-junctioned--.

Column 13, Line 27, replace "Schottky functioned" with --Schottky-junctioned--.

In the Claims

Column 15, Claim 1, Line 41, replace "Schottky functioned" with --Schottky-junctioned--.

Column 16, Claim 2, Line 5, replace "Schottky functioned" with --Schottky-junctioned--.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*